United States Patent [19]
Gordon et al.

[11] Patent Number: 6,071,561
[45] Date of Patent: Jun. 6, 2000

[54] CHEMICAL VAPOR DEPOSITION OF FLUORINE-DOPED ZINC OXIDE

[75] Inventors: Roy G. Gordon, Cambridge, Mass.; Keith Kramer, Avon Lake, Ohio; Haifan Liang, Santa Clara, Calif.

[73] Assignee: President and Fellows of Harvard College, Cambridge, Mass.

[21] Appl. No.: 09/242,093

[22] PCT Filed: Aug. 13, 1997

[86] PCT No.: PCT/US97/11552

§ 371 Date: Jun. 16, 1999

§ 102(e) Date: Jun. 16, 1999

[87] PCT Pub. No.: WO98/08245

PCT Pub. Date: Feb. 26, 1998

[51] Int. Cl.[7] .................................................. C23C 16/40
[52] U.S. Cl. .................. 427/255.33; 427/126.3; 427/255.31
[58] Field of Search ................ 427/255.33, 255.31, 427/126.3, 166

[56] References Cited

U.S. PATENT DOCUMENTS

| | | |
|---|---|---|
| 4,187,336 | 2/1980 | Gordon . |
| 4,623,426 | 11/1986 | Peters ........................................ 156/614 |
| 4,751,149 | 6/1988 | Vijayakumar et al. . |
| 4,990,286 | 2/1991 | Gordon ..................................... 252/518 |

FOREIGN PATENT DOCUMENTS

WO 90/11247  10/1990  WIPO .

OTHER PUBLICATIONS

Briot et al, MRS, Symp. Proc. vol. 340, 1994, pp. 515–520, 1994.
Jones et al, Journal of Crystal Growth 130 pp. 295–299, 1993.
Kaufmann et al., "Metalorganic Chemical Vapour Deposition of Oriented ZnO Films" Crystal Research & Technology 23:635–639 (1988).
Savitskaya et al., "Preparation of Thin Films of Zinc Oxide" Shurnal Prikladnoi Khimii 37:796–800 (1962).
Ryabova et al., "Production of Oriented Films of Zinc Oxide" Meorganischeskie Materialy 4:602 (1968).

*Primary Examiner*—Roy V. King
*Attorney, Agent, or Firm*—Clark & Elbing LLP; Mary Rose Scozzafava

[57] ABSTRACT

Fims of fluorine-doped zinc oxide are deposited from vaporized precursor compounds comprising a chelate of a dialkylzinc, such as an amine chelate, an oxygen source, and a fluorine source. The coatings are highly electrically conductive, transparent to visible light, reflective to infrared radiation, absorbing to ultraviolet light, and free of carbon impurity.

20 Claims, No Drawings

6,071,561

CHEMICAL VAPOR DEPOSITION OF FLUORINE-DOPED ZINC OXIDE

This application is a national stage of PCT/US97/11552 filed Aug. 13, 1997.

STATEMENT AS TO FEDERALLY SPONSORED RESEARCH

The invention was made under a contract with the Department of Energy of the United States Government, DOE Grant Number XAN-4-13318-05.

BACKGROUND OF THE INVENTION

Zinc oxide is a wide-bandgap semiconductor that is transparent to visible light. U.S. Pat. No. 4,751,149 to Vijayakumar et al. disclosed that the electrical conductivity of zinc oxide can be increased greatly by adding small amounts of the group 13 elements boron, aluminum, gallium or indium. Addition of these dopants, however, decreases the transparency of the zinc oxide. U.S. Pat. No. 4,990,286 to Gordon disclosed that fluorine is also effective in increasing the electrical conductivity of zinc oxide films, and that the resulting films have higher transparency than those doped with group 13 dopants. The greater transparency of the fluorine-doped films gives them better performance in devices such as solar cells, flat-panel display devices, electrochromic absorbers and reflectors, energy-conserving heat mirrors, and anti-static coatings.

Zinc oxide may be formed by reactions of vapors of a wide variety of zinc-containing compounds. These processes are called chemical vapor deposition (CVD) processes.

Some widely-used zinc CVD precursors are dialkylzinc compounds, having the general form $ZnR_2$, in which R stands for an organic radical, such as methyl, ethyl, isopropyl, etc. Examples of these precursors are dimethylzinc and diethylzinc. In U.S. Pat. No. 4,751,149 vapors of a dialkylzinc compound are mixed with water vapor and diborane near a heated surface, on which a layer of boron-doped zinc oxide is deposited. In U.S. Pat. No. 4,990,286 vapors of a dialkylzinc compound are mixed with alcohol vapor and hexafluoropropene near a heated surface, on which a layer of fluorine-doped zinc oxide is deposited.

Dialkylzinc compounds have some disadvantages in a CVD process. Dialkylzinc compounds are pyrophoric, that is they ignite spontaneously in air, so that they are a serious fire hazard. Even small amounts of oxygen in the CVD chamber cause powdered zinc oxide to form. Thus the prior art CVD processes for forming zinc oxide films from dialkylzinc compounds can be disrupted by air leaks into the CVD chamber.

Complexes of dialkylzinc compounds with tetrahydrofuran have been proposed as CVD sources for zinc oxide by T. Kaufmann, G. Fuchs and M. Webert, in Crystal Research & Technology, vol. 23, pp. 635–639 (1988). However, these complexes are not very stable, and they dissociate in the gas phase unless a more than 100-fold excess of tetrahydrofuran is used.

Non-pyrophoric zinc CVD sources have also been found. Zinc propionate was discovered to be a CVD source material for zinc oxide films by Y. A. Savitskaya and L. A. Ryobova, Zhurnal Prikladnoi Khimii, Vol. 37, pp. 796–800 (1962). Zinc acetylacetonate was used similarly by L. A. Ryabova, Y. S. Savitskaya and R. N. Sheftal, Izvestia Akademii Nauk. SSSR, Neorganischeskie Materialy, Vol. 4, p. 602 (1968). Zinc acetate was claimed as a CVD precursor for films with electronic purposes by M. Hattori and T. Maeda in Japan. Kokai 73 29,699 (1973). These non-pyrophoric sources are solids, so they are less convenient to handle than liquids are, and they are more difficult to vaporize.

SUMMARY OF THE INVENTION

A principal object of the present invention is to deposit fluorine-doped zinc oxide having high electrical conductivity, high visible transparency, high infrared reflectivity, and high purity.

Another object of the present invention is the deposition of fluorine-doped zinc oxide films from precursors that are not pyrophoric.

A further object of the present invention is to deposit fluorine-doped zinc oxide from a robust chemical vapor deposition process which is not easily disrupted by leaks of air into the deposition region.

A related object is to deposit fluorine-doped zinc oxide by a chemical vapor deposition process in which all the reactant vapors may be mixed homogeneously before delivery to the heated surface of the substrate.

Another object of the invention is to provide a chemical vapor deposition process for fluorine-doped zinc oxide from reactants that are commercially available, stable and relatively non-hazardous.

Other objects of the invention will be obvious to those skilled in the art on reading the instant invention.

The above objects have been substantially achieved by a process for the chemical vapor deposition of fluorine-doped zinc oxide from vapors comprising a chelate of a dialkylzinc compound, an oxygen source, and a fluorine source. One preferred embodiment uses a vapor mixture of the N,N,N', N'-tetraethylethylenediamine chelate of diethylzinc, ethanol, hexafluoropropene and optionally, an inert carrier gas such as nitrogen. This vapor mixture is brought into contact with a substrate heated to a temperature in the range of about 400 to 500° C., most preferably about 425 to 475° C. Under these conditions, a transparent, electrically conductive, infrared reflective film of fluorine-doped zinc oxide is deposited on the substrate. The N,N,N',N'-tetraethylethylenediamine chelate of diethylzinc is a non-pyrophoric liquid, in contrast to the hazardous, pyrophoric liquid diethylzinc.

DETAILED DESCRIPTION OF THE INVENTION

The process of the invention can be carried out in standard equipment well known in the art for chemical vapor deposition. The apparatus brings the vapors of the reactants into contact with a heated substrate on which the metal oxide deposits. The process can operate at a variety of pressures, including in particular normal atmospheric pressure, and also lower pressures.

The reactants may be vaporized by means well-known in the art, including passing a carrier gas through a heated liquid or powdered solid in a bubbler, or injecting or spraying a liquid or a solution into a flow of heated carrier gas.

The zinc chelates suitable for the practice of this invention consist of dialkylzinc molecules each of which has its zinc atom bonded to two or more nitrogen atoms in a tertiary organic diamine or polyamine. Although it is expected that oxygen, sulfur and phosphine based organic chelates will have a lower affinity for dialkylzinc, such chelates are also contemplated as within the scope of the invention. Zinc chelates with organic amines provide a non-pyrophoric liquid or soluble solid, which can be easily vaporized for use in CVD processes. Further, these compounds have been demonstrated to be reactive CVD source materials for preparation of zinc oxide films.

Many of the chelates were found to be liquids at room temperature. Those that were solids at room temperature were found to be very soluble in xylene. The xylene solutions are convenient for transferring and vaporizing these compounds.

The N,N,N',N'-tetraethylethylenediamine chelate of diethylzinc may be prepared by slowly adding diethylzinc to dry N,N,N',N'-tetraethylethylenediamine while stirring under an inert nitrogen atmosphere and cooling to remove the heat of reaction. The product is a non-pyrophoric liquid that can be distilled at 92° C. under a pressure of 20 millibar.

The other chelates used in the following examples were prepared in a similar way. The required diamines are all commercially available, except for the N-ethyl-N',N',N'-trimethylethylenediamine used in Example 4. The N-ethyl-N',N',N'-trimethylethylenediamine was prepared from commercially available N,N,N-trimethylethylenediamine by reacting it with acetic anhydride, and neutralizing the product with NaOH. Then the resulting amide was reduced with lithium aluminum hydride in ether solution. After hydrolysis and filtration, the product was extracted in ether and separated by distillation.

Any oxygen-containing compound which exhibits affinity for zinc and which demonstrates an ability to deposit oxygen on heated substrate surfaces may be used in the deposition process. Alcohols are preferred sources for the formation of zinc oxide film, although other oxygen-containing sources such as ethers, may be used.

Zinc oxide films containing some carbon impurity can make the film absorb visible light, giving it a brown color. Adding an excess of alcohol vapor to the gas mixture substantially eliminates the carbon impurity and the brown color, giving clear, transparent zinc oxide films. It is preferred to use at least 10 times as many moles of alcohol vapor as zinc chelate.

In practicing this deposition process, we observed that nucleation of the zinc oxide films on glass surfaces can be erratic and not reproducible. This effect was easily seen by observing samples from different runs, which showed different amounts of diffusely scattered light, called haze. This haze arises from light scattered by the tiny crystals of zinc oxide in the films. When zinc oxide nuclei form at a higher density on a glass surface, the crystals are smaller and cause less haze. When the glass surface was first coated with a thin film of aluminum oxide, subsequent deposition of zinc oxide showed a high and very consistent nucleation density.

An explanation of the effect of aluminum oxide precoating can be based on the well-known catalytic effect that aluminum oxide surfaces have on the decomposition of alcohols into water and unsaturated hydrocarbons. The water produced by this decomposition rapidly reacts with the zinc precursors to nucleate and deposit zinc oxide on the surface of the aluminum oxide. In contrast, the undecomposed alcohol produces zinc oxide much more slowly and nucleates less efficiently. The same effect was shown by precoating the glass with other catalytically active oxide films, including titanium dioxide, tin dioxide and zinc oxide.

Aluminum oxide with small additions of titanium dioxide is a particularly effective precoating for producing highly transparent zinc oxide films, because the refractive index (n) of such a mixture can be adjusted to be intermediate (n=1.7) between that of the glass (n=1.5) and that of the fluorine-doped zinc oxide (n=1.9), thereby reducing the amount of light lost in reflection.

In the following examples, the glass substrates were first coated with amorphous aluminum oxide by chemical vapor deposition at 550° C. glass temperature from a vapor mixture including aluminum acetylacetonate and oxygen, as described in example 2 of U.S. Pat. No. 4,187,336. An additional benefit of using the amorphous aluminum oxide is that it prevents diffusion of sodium from the glass substrates into the fluorine-doped zinc oxide film, whose electrical conductivity can be decreased by sodium. Aluminum oxide is also highly resistant to etching by fluorine-containing reaction byproducts, such as hydrogen fluoride, which might otherwise attack the glass surface.

When the deposition process is carried out at substrate temperatures around 400° C., the zinc oxide films were smooth and had low haze. Such clear films are preferred for applications such as liquid crystal displays. When the substrate temperature during deposition was increased to around 450° C., the crystallites of zinc oxide become larger, and films greater in thickness than about 0.5 micrometer scattered some light, giving a hazy appearance. Such hazy films can be used to increase the amount of light absorbed by solar photovoltaic cells.

Adding a small amount of fluorine (typically less than about one atomic per cent) to zinc oxide dramatically increases its electrical conductivity. In the practice of this invention, a suitably reactive fluorine-containing vapor is added to the zinc chelate vapor and the oxygen-containing vapor, to deposit fluorine-doped zinc oxide on a heated substrate. Particularly suitable fluorine sources are fluorocarbon compounds, which contain fluorine bound to carbon atoms. Fluoroalkenes have sufficient reactivity to introduce fluorine into the growing zinc oxide film, while fluoroalkanes are unreactive under the conditions used. Hexafluoropropene is one preferred fluoroalkene source of fluorine, and tetrafluoroethene is another. Other sufficiently reactive fluorocarbon compounds are acetyl fluoride, carbonyl fluoride, benzoyl fluoride and hexafluoropropene oxide.

EXAMPLE 1

The liquid N,N,N',N'-tetraethylethylenediamine chelate of diethylzinc was vaporized by injecting it at a rate of 0.1 milliliters/min from a syringe pump into a flow of 4 liters per minute of dry nitrogen preheated to a temperature of 200° C. Dry ethanol was placed in a bubbler and heated to 70° C. Dry nitrogen flowed through the bubbler at a rate of 0.5 liter/minute, and the vapor mixture exiting from the bubbler was diluted by an additional flow of 0.8 liters/minute of dry nitrogen. Hexafluoropropene gas flowed from a pressurized supply tank at a rate of 0.05 liters/minute into the ethanol/nitrogen gas mixture.

These two vapor mixtures were combined at a tee joint, from which they flowed through a line heated to 200° C. into the entrance to a CVD chamber measuring 10 cm wide by 0.6 cm high by 7 cm long (in the direction of the gas flow). A glass substrate rested on the bottom of the CVD chamber, which is heated from below, so that the glass plate was held at a temperature of about 450° C., while the top plate of the CVD chamber was at about 300° C.

Prior to the deposition and while the glass plate was heating up, dry nitrogen passed through the chamber. Valves then switched on the flows of zinc chelate vapor and ethanol through the chamber for five minutes, during which a layer of fluorine-doped zinc oxide formed. Then the reactant flows were stopped, the nitrogen flow was returned to the chamber, and the glass plate was removed.

On the surface of the glass plate there was a transparent coating of fluorine-doped zinc oxide with a maximum thickness of about 500 nanometers. The sheet resistance was as low as 10 ohms per square, and the absorption of visible light was not more than 2%. Analysis of the film showed that it consisted of nearly stoichiometric zinc monoxide and small amounts (less than 0.5 atomic percent) of fluorine.

EXAMPLE 2

Example 1 was repeated with the liquid N,N-diethyl-N',N'-dimethylethylenediamine chelate of diethylzinc in place of the N,N,N',N'-tetraethylethylenediamine chelate of diethylzinc. A similar deposit of transparent, electrically conductive fluorine-doped zinc oxide was formed.

EXAMPLE 3

Example 1 was repeated with the liquid N,N'-diethyl-N,N'-dimethylethylenediamine chelate of diethylzinc in place of the N,N,N',N'-tetraethylethylenediamine chelate of diethylzinc. A similar deposit of transparent, electrically conductive fluorine-doped zinc oxide was formed.

EXAMPLE 4

Example 1 was repeated with the liquid N-ethyl-N',N',N'-trimethylethylenediamine chelate of diethylzinc in place of the N,N,N',N'-tetraethylethylenediamine chelate of diethylzinc. A similar deposit of transparent, electrically conductive fluorine-doped zinc oxide was formed.

EXAMPLE 5

The N,N,N',N'-tetramethylethylenediamine chelate of diethylzinc is a solid at room temperature. It was found to be soluble to an extent of more than 50 weight per cent in the mixed isomers of xylene. Example 1 was repeated with a 50% by weight solution in xylene of the N,N,N',N'-tetramethylethylenediamine chelate of diethylzinc, in place of the N,N,N',N'-tetraethylethylenediamine chelate of diethylzinc, except that the pumping rate of the solution was increased to 0.2 milliliters/minute. A similar deposit of transparent, electrically conductive fluorine-doped zinc oxide was formed.

EXAMPLE 6

Example 5 was repeated with a 50% by weight solution in xylene of the low-melting solid 1,4-dimethylpiperazine chelate of diethylzinc, in place of the solution of N,N,N',N'-tetramethylethylenediamine chelate of diethylzinc. A similar deposit of transparent, electrically conductive fluorine-doped zinc oxide was formed.

EXAMPLE 7

Example 5 was repeated with a 50% by weight solution in xylene of the solid N,N,N',N'-tetramethyl-1,3-propanediamine chelate of diethylzinc, in place of the solution of N,N,N',N'-tetramethylethylenediamine chelate of diethylzinc. A similar deposit of transparent, electrically conductive fluorine-doped zinc oxide was formed.

EXAMPLE 8

Example 5 was repeated, except that the fluorine dopant was 0.5 weight per cent acetyl fluoride dissolved in the solution, and the hexafluoropropene fluorine gas was omitted. A similar deposit of transparent, electrically conductive fluorine-doped zinc oxide was formed.

The liquids and solutions used in these examples were all tested to be non-pyrophoric by the methods published by the United States Department of Transportation. The test involves dropping 0.5 milliliters of the liquid or solution on a Whatman No. 3 filter paper, and observing that no flame or charring of the paper occurs.

EXAMPLE 9

Example 8 was repeated with 0.6 weight per cent of benzoyl fluoride in place of the acetyl fluoride. A film with sheet resistance of about 10 ohms per square was obtained.

EXAMPLE 10

The remaining unused solution from Example 9 was stored at room temperature for one day. Then another film of fluorine doped zinc oxide was deposited using part of the same solution. The sheet resistance of the fluorine-doped zinc oxide film was reduced from about 10 ohms per square to about 8 ohms per square.

Further samples were made with this same solution during the next month, and the resistances were all around 8 ohms per square. After about a month, samples made from the old solution had higher resistances.

Those skilled in the art will recognize or be able to ascertain using no more than routine experimentation, many equivalents to the specific embodiments of the invention described specifically herein. Such equivalents are intended to be encompassed in the scope of the following claims.

What is claimed is:

1. A process for forming transparent, electrically conductive and infrared reflective fluorine-doped zinc oxide by reaction of a vapor mixture comprising a vapor of a chelate of a dialkylzinc, an oxygen-containing vapor, and a fluorine-containing vapor.

2. The process of claim 1, wherein the chelate comprises an amine chelate.

3. The process of claim 1, in which the amine chelate of dialkylzinc is a tertiary diamine chelate of a dialkylzinc.

4. The process of claim 2, in which the tertiary diamine chelate of dialkylzinc is the N,N,N',N'-tetraethylethylenediamine chelate of diethylzinc.

5. The process of claim 2, in which the tertiary diamine chelate of dialkylzinc is the N,N-diethyl-N',N'-dimethylethylenediamine chelate of diethylzinc.

6. The process of claim 2, in which the tertiary diamine chelate of dialkylzinc is the N,N'-diethyl-N,N'-dimethylethylenediamine chelate of diethylzinc.

7. The process of claim 2, in which the tertiary diamine chelate of dialkylzinc is the N-ethyl-N',N',N'-trimethylethylenediamine chelate of diethylzinc.

8. The process of claim 2, in which the tertiary diamine chelate of dialkylzinc is the N,N,N',N'-tetramethylethylenediamine chelate of diethylzinc.

9. The process of claim 2, in which the tertiary diamine chelate of dialkylzinc is the N,N,N',N'-tetramethyl-1,3-propanediamine chelate of diethylzinc.

10. The process of claim 2, in which the tertiary diamine chelate of dialkylzinc is the 1,4-dimethylpiperazine chelate of diethylzinc.

11. The process of claim 1, in which the reactive fluorine-containing compound is an organic fluoride.

12. The process of claim 11, in which the organic fluoride is selected from the group consisting of hexafluoropropene, tetrafluoroethene, acetyl fluoride, carbonyl fluoride, benzoyl fluoride and hexfluoropropene oxide.

13. The process of any of the preceding claims, in which said vapor mixture contains an alcohol.

14. The process of claim 13, in which said alcohol is ethanol.

15. The process of claim 1, in which said fluorine-doped zinc oxide layer is formed on a layer comprising one or more oxides selected from the group consisting of aluminum oxide, titanium oxide, tin oxide and zinc oxide.

16. The process of claim 1, in which said fluorine-doped zinc oxide layer is formed on a layer of aluminum oxide.

17. A process for forming a layer comprising zinc oxide by reaction of a vapor mixture comprising a vapor of an amine chelate of dialkylzinc and an oxygen-containing vapor.

18. A process as in claim 17, in which the oxygen-containing vapor is an alcohol.

19. A process as in claim 18, in which the alcohol is ethanol.

20. The process of claim 17, wherein the zinc oxide layer comprises transparent, electrically conductive and infrared reflective fluorine-doped zinc oxide.

* * * * *